United States Patent
Ruitenburg

(10) Patent No.: US 7,342,529 B2
(45) Date of Patent: Mar. 11, 2008

(54) ANALOG-TO-DIGITAL-CONVERTING AND SUPPRESSING SYSTEM

(75) Inventor: Leonardus Joseph Michael Ruitenburg, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/576,551

(22) PCT Filed: Oct. 8, 2004

(86) PCT No.: PCT/IB2004/052026

§ 371 (c)(1),
(2), (4) Date: Apr. 19, 2006

(87) PCT Pub. No.: WO2005/039055

PCT Pub. Date: Apr. 28, 2005

(65) Prior Publication Data

US 2007/0080840 A1 Apr. 12, 2007

(30) Foreign Application Priority Data

Oct. 21, 2003 (EP) ................................ 03103880

(51) Int. Cl.
*H03M 1/12* (2006.01)
(52) U.S. Cl. ...................................... 341/155; 341/139
(58) Field of Classification Search ......... 341/120–155
See application file for complete search history.

(56) References Cited

U.S. PATENT DOCUMENTS

| | | | | |
|---|---|---|---|---|
| 5,307,515 A | * | 4/1994 | Kuo et al. | 455/295 |
| 5,379,445 A | * | 1/1995 | Arnstein et al. | 455/13.4 |
| 6,178,314 B1 | * | 1/2001 | Whikehart et al. | 455/188.1 |
| 6,798,832 B1 | * | 9/2004 | Nakata et al. | 375/233 |
| 7,127,226 B2 | * | 10/2006 | Tolson | 455/296 |
| 7,298,232 B2 | * | 11/2007 | Rauscher | 333/135 |
| 7,299,534 B2 | * | 11/2007 | Rauscher | 333/135 |

FOREIGN PATENT DOCUMENTS

| | | | | |
|---|---|---|---|---|
| EP | 1 156 589 | | 11/2001 | |
| EP | 1 156 589 A1 | * | 11/2001 | 375/233 |
| WO | WO 00/55977 | | 9/2000 | |

* cited by examiner

*Primary Examiner*—Lam T. Mai

(57) ABSTRACT

A system for converting analog wanted signals to digital wanted signals includes an analog filter, an analog-to-digital-converter, and a compensator. The analog filter at least partly suppresses both the analog wanted signals and analog unwanted signals. The compensator is used to compensate the digital output signals for the partly suppressing of the analog wanted signals. A method for converting analog wanted signals to digital wanted signals includes at least partly suppressing both the analog wanted signals and the analog unwanted signals and then compensating the wanted digital signals for the partly suppressing of the analog wanted signals.

12 Claims, 1 Drawing Sheet

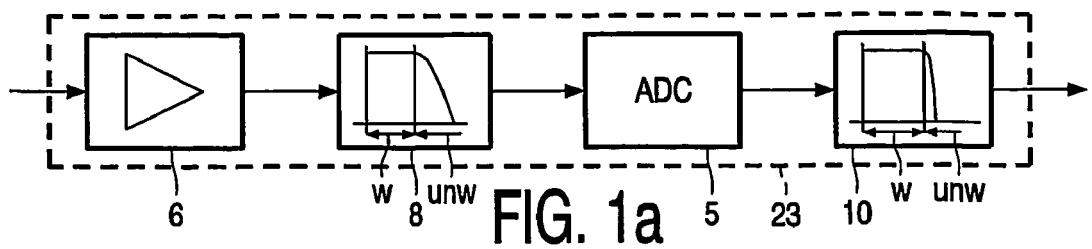
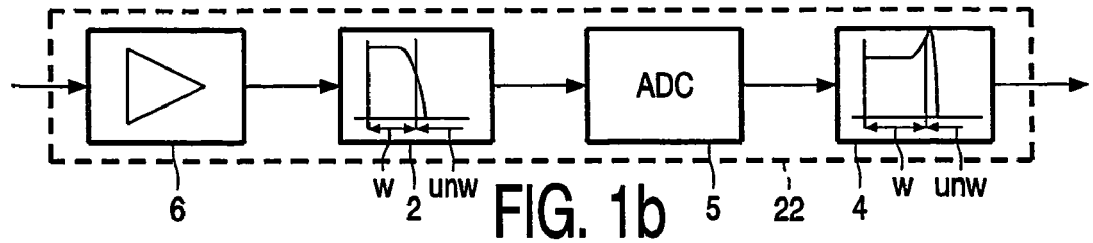
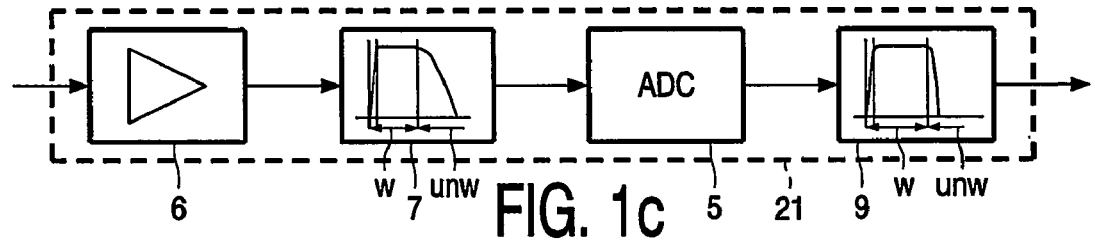
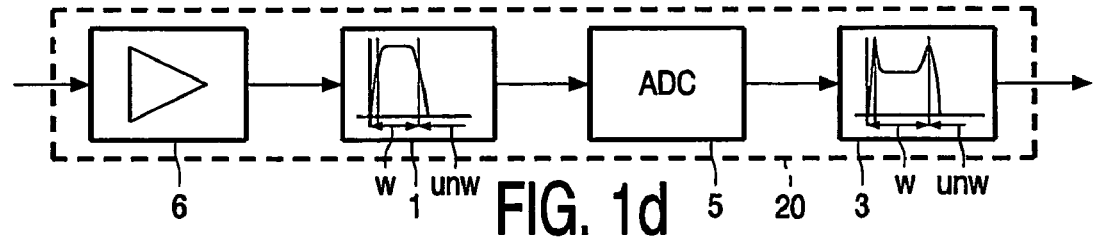
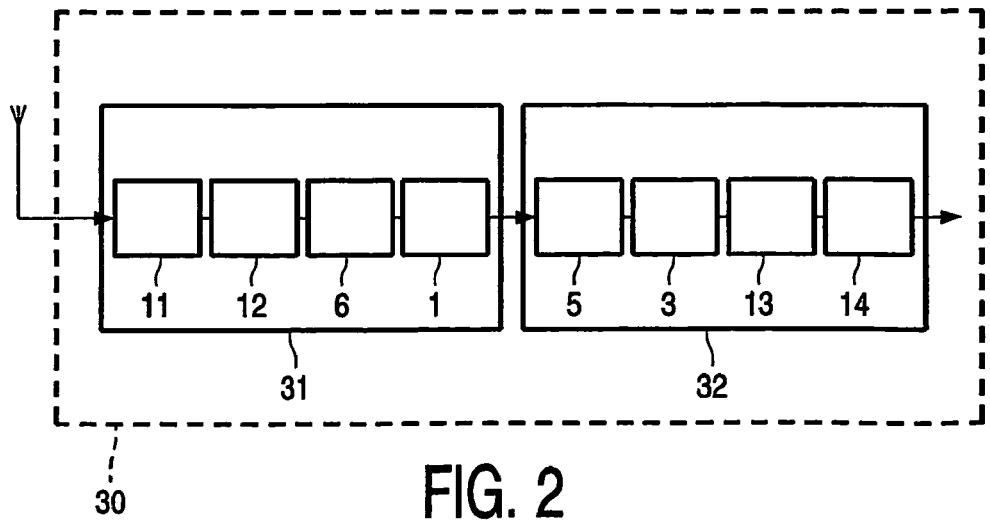

ANALOG-TO-DIGITAL-CONVERTING AND SUPPRESSING SYSTEM

The invention relates to converting an analog wanted signal into a digital wanted signal and for suppressing an analog unwanted signal, and to a receiver comprising a tuner and a channel decoder, and to a tuner and a channel decoder for use in such a receiver.

Examples of such a receiver are televisions, set-top-boxes, mobile terminals like mobile phones, and modems.

A prior art system is known from WO 00/55977, which discloses an analog filter and an analog-to-digital-converter in a radio receiver. This radio receiver receives a radio signal comprising modulated analog and/or digital information. The radio signal is frequency down converted into an intermediate frequency signal. Due to frequency conversions, disturbances and non-ideal components, this intermediate frequency signal comprises not just an analog wanted signal (comprising the modulated analog and/or digital information), but also an analog unwanted signal. The analog filter suppresses the analog unwanted signal and passes the analog wanted signal to the analog-to-digital-converter, which converts the analog wanted signal into a digital output signal.

The signal-to-noise-ratio (SNR) of a digital output signal of an analog-to-digital-converter (ADC) depends on the ratio between a peak level of the wanted+unwanted signals, which can be dominated by a strong unwanted signal, and the root-mean-square level (RMS) of the wanted signal. A higher clock frequency and/or a higher (effective) number of bits in the analog-to-digital-converter can be used to improve the performance. The expression is as follows:

$$\text{SNR[dB]}=6\text{ENOB}+1.76\text{dB}+10\log(f_{clock}/B_s)-20\log(U_{tot,peak}/U_{s,RMS})$$

Wherein

ENOB=the effective number of ADC bits (ADC is not ideal);

ENOB=N=the physical number of ADC bits;

$f_{clock}$=the clock frequency of the ADC;

$B_s$=the wanted signal bandwidth;

$U_{tot,peak}$=the peak voltage level of the wanted+unwanted signals;

$U_{s,RMS}$=the RMS voltage level of the wanted signal $U_s$.

The analog filter before the analog-to-digital-converter is normally intended for maximal suppression of the unwanted signal in an adjacent channel, without affecting the wanted signal spectrum. As can be seen in the formula, the signal-to-noise-ratio will increase by that. By reducing the (effective) number of bits, the signal-to-noise-ratio will also increase. This property makes a trade-off between both possible. Some other possibility, seen from the formula, is the possible reduction of clock frequency, which is allowed when the peak voltage is reduced.

The prior art system is disadvantageous, inter alia, due to comprising an analog filter that should not affect the analog wanted signal spectrum. To maximally suppress the analog unwanted signal, without affecting the analog wanted signal spectrum, the analog filter must have a high complexity. When suppressing the analog unwanted signal to a certain degree only, without affecting the analog wanted signal spectrum, the signal-to-noise-ratio of the analog-to-digital-converter will decrease.

It is an object of the invention, inter alia, to provide an improved system for converting an analog wanted signal into a digital wanted signal and for suppressing an analog unwanted signal. The invention is defined by the independent claims. The dependent claims define advantageous embodiments.

By introducing the analog filter for not just at least partly suppressing the analog unwanted signal but also at least partly suppressing the analog wanted signal, the analog unwanted signal in an adjacent channel can now be suppressed better than before, at the cost of also partly suppressing the analog wanted signal in a wanted channel. By introducing the compensator for compensating the digital output signal for the partly suppressing of the analog wanted signal, the wanted signal is restored. As a result, (limited) suppression of signal components by narrow filtering is now allowed, which will be compensated by an inverse selectivity curve in the wanted signal bandwidth after the analog-to-digital-converter. Due to the narrow filtering, significantly more signal power from the adjacent channel can be suppressed with an analog filter of the same order (complexity, number of components) as before.

The improved system according to the invention offers the possibility of achieving a better signal-to-noise-ratio of this system compared to prior art systems. Alternatively, the signal-to-noise-ratio of prior art systems can be achieved by using a less complex and/or less expensive and/or less power consuming analog-to-digital-converter having either a lower resolution expressed in a lower number of bits or operating at a lower clock frequency. Further, combinations of slightly improved signal-to-noise-ratios and slightly less complex and/or less expensive and/or less power consuming analog-to-digital-converters are now possible.

A first embodiment of the system according to the invention is defined by the compensator comprising a digital filter or an equalizer. Such a digital filter or equalizer for example performs digital signal processing and is common in the art.

A second embodiment of the system according to the invention is defined by the analog wanted signal being a low intermediate frequency signal. For low intermediate frequency receivers or low IF receivers, the system according to the invention is advantageous due to adjacent channel selectivity being realized on an analog integrated circuit before entering the analog-to-digital-converter.

A third embodiment of the system according to the invention is defined by the analog wanted signal being a zero intermediate frequency signal, with a first set of analog filter, analog-to-digital-converter and compensator converting and suppressing an in-phase signal and with a second set of analog filter, analog-to-digital-converter and compensator converting and suppressing a quadrature signal. For zero intermediate frequency receivers or zero IF receivers, the system according to the invention is advantageous due to adjacent channel selectivity being realized on an analog integrated circuit before entering the analog-to-digital-converter.

A fourth embodiment of the system according to the invention is defined by the analog filter and the compensator being matched. The required filter characteristics before and after the analog-to-digital-converter need both to be well defined. In this case, the filters are matched by design, and any adaptivity and/or control loop in the compensator is/are avoided.

A fifth embodiment of the system according to the invention is defined by the compensator being adaptive and/or comprising a control loop to avoid any matching between the analog filter and the compensator. By adaptively filtering in the digital domain, the digital system corrects for frequency characteristic errors.

A sixth embodiment of the system according to the invention is defined by further comprising an amplifier for amplifying the analog wanted signal and the analog unwanted signal. This amplifier is coupled to an input of the analog filter and allows the input range of the analog-to-digital-converter being used optimally. Compared to being located after the analog filter, the location of the amplifier before the analog filter is better for achieving a low noise level.

A seventh embodiment of the system according to the invention is defined by further comprising an amplifier for amplifying the analog output signal. This amplifier is located between an output of the analog filter and an input of the analog-to-digital-converter and allows the input range of the analog-to-digital-converter being used optimally.

Embodiments of the method according to the invention and of the receiver according to the invention correspond with the embodiments of the system according to the invention.

The invention is based upon an insight, inter alia, that prior art systems, in which the adjacent channel is not suppressed completely, have a relatively bad signal-to-noise-radio, which can be improved by increasing the resolution of the analog-to-digital converter by increasing its number of bits (more complex and more expensive) or by increasing its clock frequency (more complex and more expensive and more power consumption), and is based upon a basic idea, inter alia, that the analog unwanted signal in the adjacent channel can be suppressed better than before, at the cost of also partly suppressing the analog wanted signal in a wanted channel, whereby the partly suppressed analog wanted signal can be compensated and restored, after the analog-to-digital-converter, by using a compensator.

The invention solves the problem, inter alia, to provide an improved system for converting an analog wanted signal into a digital wanted signal and for suppressing an analog unwanted signal, and is advantageous, inter alia, in that the signal-to-noise-ratio of the system is improved, whereby alternatively a less complex and/or less expensive and/or less power consuming analog-to-digital-converter can be used having either a lower resolution expressed in a lower number of bits or operating at a lower clock frequency.

These and other aspects of the invention will be apparent from and elucidated with reference to the embodiments(s) described hereinafter.

IN THE DRAWINGS

FIG. 1a-1d show in block diagram form (a) a prior art system, (b) a system according to the invention both for zero intermediate frequency signals, (c) a prior art system, and (d) a system according to the invention both for low intermediate frequency signals; and FIG. 2 shows in block diagram form a receiver according to the invention comprising a tuner according to the invention and a channel decoder according to the invention.

The prior art system 23 for zero intermediate frequency signals as shown in FIG. 1a comprises a series circuit of an amplifier 6, an analog filter 8, an analog-to-digital converter 5 and a digital filter 10. The amplifier 6 receives a zero intermediate frequency signal comprising not just an analog wanted signal indicated by "w" in a wanted channel (with modulated analog and/or digital information), but also comprising an analog unwanted signal indicated by "unw" in an adjacent channel. The analog filter 8 does hot have any in-channel roll-off, and therefore leaves the analog wanted signal substantially as it is, and suppresses only a part of the analog unwanted signal. As a result, the adjacent channel cannot be suppressed completely, and a part of the analog unwanted channel, together with the analog wanted channel, will be supplied to the analog-to-digital-converter 5. The limited resolution and the limited input range of the analog-to-digital-converter 5 are then available for converting the entire analog input signal comprising the analog wanted signal and the part of the analog unwanted signal not filtered completely. In other words, at a predefined clock frequency and for a predefined input range, some of the bits of the analog-to-digital-converter 5 are available for converting the analog wanted signal, and the other bits of the analog-to-digital-converter 5 are required for converting the part of the analog unwanted signal not suppressed completely. This is relatively inefficient, and decreases the signal-to-noise-ratio of the system 23. Digital filter 10 filters a digital output signal coming from analog-to-digital-converter 5 to suppress a digital unwanted signal in the adjacent channel for improving the performance of the system 23.

The system 22 according to the invention for zero intermediate frequency signals as shown in FIG. 1b comprises a series circuit of an amplifier 6, an analog filter 2, an analog-to-digital converter 5 and a compensator 4 (like a digital filter or an equalizer). The amplifier 6 receives the zero intermediate frequency signal comprising not just the analog wanted signal indicated by "W" in the wanted channel (with modulated analog and/or digital information), but also comprising the analog unwanted signal indicated by "unw" in the adjacent channel. The analog filter 2 has in-channel roll-off, and therefore suppresses the analog unwanted signal in the adjacent channel now better compared to the prior art situation as shown in FIG. 1(a), at the cost of also suppressing a part of the analog wanted signal in the wanted channel. As a result, at a predefined clock frequency and for a predefined input range, according to the invention, more bits of the analog-to-digital-converter 5 are available for converting the analog wanted signal, and less bits of the analog-to-digital-converter 5 are required for converting the part of the analog unwanted signal not suppressed completely. So, in the system 22 according to the invention, the analog-to-digital-converter 5 is used relatively efficiently, which increases the signal-to-noise-ratio of the system 22. By introducing the compensator 4 for compensating the suppressed part of the analog wanted signal, the wanted signal is restored. Thereto, in the wanted channel, the characteristic of the compensator 4 corresponds with an inverted version of the characteristic of the analog filter 2, and in the adjacent channel, the characteristic of the compensator 4 is such that the digital unwanted signal is suppressed as much as possible, similar to the characteristic of the analog filter 2 being such that the analog unwanted signal is suppressed as much as possible.

Due to zero intermediate frequency signals comprising in-phase signals and quadrature signals, a first set of analog filter 2, analog-to-digital-converter 5 and compensator 4 will be used for converting and suppressing the in-phase signal, and a second set (not shown) of analog filter, analog-to-digital-converter and compensator will be used for converting and suppressing the quadrature signal. For zero intermediate frequency receivers or zero IF receivers, the system 22 according to the invention is advantageous due to adjacent channel selectivity being realized on an analog integrated circuit before entering the analog-to-digital-converter 5.

The prior art system 21 for low intermediate frequency signals as shown in FIG. 1c comprises a series circuit of an amplifier 6, an analog filter 7, an analog-to-digital converter 5 and a digital filter 9. The amplifier 6 receives a low intermediate frequency signal comprising not just an analog wanted signal indicated by "w" in a wanted channel (with modulated analog and/or digital information), but also comprising an analog unwanted signal indicated by "unw" in an adjacent channel, etc. as already described for FIG. 1(a) Thereby it should be noted that unwanted signal could in principle be on both sides (upper as well as lower adjacent channels are possible) of the wanted frequency spectrum. Between zero and the lowest frequency of the wanted spectrum, some unwanted signal power could be present.

The system 20 according to the invention for low intermediate frequency signals as shown in FIG. 1d comprises a series circuit of an amplifier 6, an analog filter 1, an analog-to-digital converter 5 and a compensator 3. The amplifier 6 receives the low intermediate frequency signal comprising not just the analog wanted signal indicated by "w" in the wanted channel (with modulated analog and/or digital information), but also comprising the analog unwanted signal indicated by "unw" in the adjacent channel, etc. as already described for FIG. 1b.

For low intermediate frequency receivers or low IF receivers, the system 20 according to the invention is advantageous due to adjacent channel selectivity being realized on an analog integrated circuit before entering the analog-to-digital-converter 5.

For example, in a frequency domain, the analog filter 1,2 reduces a highest frequency of the analog wanted signal by at least 3 dB, and the compensator 3,4 improves the highest frequency of a digital wanted signal by at least 3 dB.

Compensator 3,4 may comprise an equalizer or a digital filter etc. To improve the correspondence between the characteristic of the compensator 3,4 and the inverted version of the characteristic of the analog filter 1,2, the analog filter 1,2 and the compensator 3,4 can be either matched by design to avoid any adaptivity and/or control loop in the compensator 3,4, or the compensator 3,4 can be made adaptive and/or be provided with such a control loop, to avoid any matching.

Analog filter 1,2 and compensator 3,4 can be designed and made common in the art.

The amplifier 6 for amplifying the analog wanted signal and the analog unwanted signal of the zero/low intermediate frequency signal allows the input range of the analog-to-digital-converter 5 being used optimally. Alternatively, this amplifier may be located between an output of the analog filter 1,2 and an input of the analog-to-digital-converter 5 for amplifying the analog output signal coming from the analog filter 1,2 to allow the input range of the analog-to-digital-converter 5 to be used optimally. Compared to being located after the analog filter 1,2, the location of the amplifier before the analog filter 1,2 is better for achieving a low noise level.

The receiver 30 according to the invention as shown in FIG. 2 comprises a tuner 31 according to the invention and a channel decoder 32 according to the invention. The tuner 31 comprises a series circuit of an input amplifier/filter 11 coupled to an antenna for receiving a radio signal, a frequency down converter 12 like for example a mixer, the amplifier 6 and the analog filter 1. The channel decoder 32 comprises a series circuit of the analog-to-digital-converter 5, the digital filter 3, a decimator 13 and a demodulator 14 for generating a demodulated signal to be supplied to for example a man-machine-interface like a loudspeaker, a display, a screen etc. The input amplifier/filter 11, the frequency down converter 12, the decimator 13 and the demodulator 14 are further disclosed and described in WO 00/55977.

Alternatively, for example equalizing can also be done later in the digital domain. So compensation for the analog in-channel characteristic is allowed to be done later than indicated in the Figures. Generally, between any two units shown in the Figures, further units may be present, and each unit shown in the Figures may comprise further sub-units, without departing from the scope of the appended claims.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. System for converting an analog wanted signal into a digital wanted signal and for suppressing an analog unwanted signal and comprising
    an analog filter for at least partly suppressing the analog wanted signal and the analog unwanted signal, resulting in an analog output signal;
    an analog-to-digital-converter for converting the analog output signal into a digital output signal; and
    a compensator for compensating the digital output signal for the at least partly suppressing of the analog wanted signal.

2. System according to claim 1, wherein the compensator comprises a digital filter or an equalizer.

3. System according to claim 1, wherein the analog wanted signal is a low intermediate frequency signal.

4. System according to claim 1, wherein the analog wanted signal is a zero intermediate frequency signal, with a first set of analog filter analog-to-digital-converter and compensator converting and suppressing an in-phase signal and with a second set of analog filter, analog-to-digital-converter and compensator converting and suppressing a quadrature signal.

5. System according to claim 1, wherein the analog filter and the compensator are matched.

6. System according to claim 1, wherein the compensator is adaptive and/or comprises a control loop to avoid any matching between the analog filter and the compensator.

7. System according to claim 1, further comprising an amplifier for amplifying the analog wanted signal and the analog unwanted signal.

8. System according to claim 1, further comprising an amplifier for amplifying the analog output signal.

9. Method of converting an analog wanted signal into a digital wanted signal and for suppressing an analog unwanted signal and comprising the steps of
    at least partly suppressing the analog wanted signal and the analog unwanted signal, resulting in an analog output signal;
    converting the analog output signal into a digital output signal; and compensating the digital output signal for the at least partly suppressing of the analog wanted signal.

10. Receiver comprising a tuner and a channel decoder the tuner comprising
an analog filter for at least partly suppressing an analog wanted signal and an analog unwanted signal, resulting in an analog output signal; and the channel decoder comprising
an analog-to-digital-converter for converting the analog output signal into a digital output signal; and
a compensator for compensating the digital output signal for the at least partly suppressing of the analog wanted signal.

11. Tuner for use in the receiver as claimed in claim 10 and comprising the analog filter for at least partly suppressing the analog wanted signal and the analog unwanted signal, resulting in the analog output signal to be supplied to the channel decoder.

12. Channel decoder for use in a receiver as claimed in claim 10 and comprising
the analog-to-digital-converter for converting the analog output signal originating from the tuner into the digital output signal; and
the compensator for compensating the digital output signal for the at least partly suppressing of the analog wanted signal.

* * * * *